US010083749B2

(12) United States Patent
Li et al.

(10) Patent No.: US 10,083,749 B2
(45) Date of Patent: *Sep. 25, 2018

(54) DATA STORAGE METHOD AND PHASE CHANGE MEMORY

(71) Applicant: Huawei Technologies Co., Ltd., Shenzhen (CN)

(72) Inventors: Zhen Li, Wuhan (CN); Qiang He, Wuhan (CN); Xiangshui Miao, Wuhan (CN); Ronggang Xu, Shenzhen (CN); Junfeng Zhao, Shenzhen (CN); Zhulin Wei, Shenzhen (CN)

(73) Assignee: Huawei Technologies Co., Ltd, Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/412,795

(22) Filed: Jan. 23, 2017

(65) Prior Publication Data

US 2017/0133090 A1 May 11, 2017

Related U.S. Application Data

(63) Continuation of application No. PCT/CN2014/082918, filed on Jul. 24, 2014.

(51) Int. Cl.
*G11C 11/56* (2006.01)
*G11C 13/00* (2006.01)

(52) U.S. Cl.
CPC ...... *G11C 13/0069* (2013.01); *G11C 11/5678* (2013.01); *G11C 13/0097* (2013.01); *G11C 2013/0092* (2013.01)

(58) Field of Classification Search
CPC ............ G11C 13/0069; G11C 13/0097; G11C 11/5678; G11C 2013/0092
See application file for complete search history.

(56) References Cited

U.S. PATENT DOCUMENTS 4,228,524 A  10/1980  Neale et al.
7,327,602 B2  2/2008  Kostylev et al.
(Continued)

FOREIGN PATENT DOCUMENTS

CN  1536688 A  10/2004
CN  1996492 A  7/2007
(Continued)

OTHER PUBLICATIONS

Bedeschi, F. et al., "A Bipolar-Selected Phase Change Memory Featuring Multi-Level Cell Storage", IEEE Journal of Solid-State Circuits, vol. 44, No. 1, Jan. 2009, 11 pages.
(Continued)

*Primary Examiner* — Khamdan Alrobaie
(74) *Attorney, Agent, or Firm* — Slater Matsil, LLP

(57) ABSTRACT

A data storage method applying to a phase change memory and the phase change memory are provided. After obtaining to-be-stored data, the phase change memory (PCM) generates an erase pulse signal and a write pulse signal according to the to-be-stored data. The to-be-stored data is multi-bit data. The write pulse signal includes at least two contiguous pulses. Intervals between the at least two contiguous pulses are the same. The intervals between the at least two contiguous pulses have a value determined according to the to-be-stored data. The PCM applies the erase pulse signal to a storage unit of the PCM to enable the storage unit to change to a crystalline state. Further, the write pulse signal is applied to the storage unit to enable the storage unit to change to an amorphous state corresponding to a first resistance value, where the amorphous state represents the to-be-stored data.

16 Claims, 6 Drawing Sheets

(56) References Cited

U.S. PATENT DOCUMENTS

| | | |
|---|---|---|
| 8,036,014 B2 | 10/2011 | Lee et al. |
| 8,107,283 B2 | 1/2012 | Chen |
| 8,149,608 B2 | 4/2012 | Lee |
| 8,238,147 B2 | 8/2012 | Bae et al. |
| 9,324,428 B1 | 4/2016 | Chien et al. |
| 9,378,821 B1* | 6/2016 | Prabhakar .............. G11C 16/10 |
| 2002/0040994 A1 | 4/2002 | Nitta et al. |
| 2003/0226749 A1 | 12/2003 | Asa |
| 2004/0114419 A1 | 6/2004 | Lowrey et al. |
| 2004/0202017 A1 | 10/2004 | Lee |
| 2007/0070682 A1* | 3/2007 | Nakashima ........ G11C 13/0007 |
| | | 365/148 |
| 2007/0153570 A1 | 7/2007 | Suh |
| 2007/0285976 A1 | 12/2007 | Happ et al. |
| 2008/0144353 A1 | 6/2008 | Lung |
| 2008/0266802 A1 | 10/2008 | Weiss et al. |
| 2009/0034324 A1 | 2/2009 | Kim et al. |
| 2009/0046495 A1* | 2/2009 | Shimaoka ................ G11C 8/08 |
| | | 365/148 |
| 2009/0225583 A1 | 9/2009 | Lee et al. |
| 2010/0067290 A1 | 3/2010 | Savransky |
| 2010/0067291 A1 | 3/2010 | Fuji |
| 2010/0124090 A1 | 5/2010 | Arai |
| 2010/0165725 A1 | 7/2010 | Bedeschi |
| 2011/0128773 A1* | 6/2011 | Azuma .............. G11C 13/0007 |
| | | 365/148 |
| 2012/0099371 A1 | 4/2012 | Kim et al. |
| 2013/0044534 A1* | 2/2013 | Kawai .............. G11C 13/0007 |
| | | 365/148 |
| 2013/0270503 A1 | 10/2013 | Miao et al. |
| 2014/0078811 A1* | 3/2014 | Kawai .................... G11C 13/00 |
| | | 365/148 |
| 2016/0232971 A1 | 8/2016 | Yoon et al. |

FOREIGN PATENT DOCUMENTS

| | | |
|---|---|---|
| CN | 101202110 A | 6/2008 |
| CN | 101359504 A | 2/2009 |
| CN | 101699562 A | 4/2010 |
| CN | 101763891 A | 6/2010 |
| CN | 101777380 A | 7/2010 |
| CN | 102142517 A | 8/2011 |
| CN | 103093815 A | 5/2013 |
| CN | 103093816 A | 5/2013 |
| JP | 2004014450 A | 1/2004 |
| JP | 2006510153 A | 3/2006 |
| JP | 2006260703 A | 9/2006 |
| JP | 2007335068 A | 12/2007 |
| JP | 2009135409 A | 6/2009 |
| JP | 2010123164 A | 6/2010 |

OTHER PUBLICATIONS

Pantazi, A. et al., "Multilevel Phase-Change Memory Modeling and Experimental Characterization", 2009, pp. 34-41.

Papandreaou, N. et al., "Multilevel Phase-Change Memory", 17th IEEE International Conference Electronics, Circuits, and Systems (ICECS), 2010, Dec. 12-15, 2010, pp. 1017-1020.

Shi, L.P. et al., "Study of the Partial Crystallization Properties of Phase-Change Optical Recording Disks", Jpn. J. Appl. Phys., vol. 38, Part 1, No. 3B, Mar. 1999, pp. 1645-1648.

Yin, Y et al., "Controlled Promotion of Crystallization for Application to Multilevel Phase-Change Memory", Applied Physics Letters 100, 253503 (2012); Jun. 19, 2012, 5 pages.

* cited by examiner

DATA STORAGE METHOD AND PHASE CHANGE MEMORY

CROSS-REFERENCE TO RELATED APPLICATIONS

This application is a continuation of International Application No. PCT/CN2014/082918, filed on Jul. 24, 2014, the disclosure of which is hereby incorporated by reference in its entirety.

TECHNICAL FIELD

Embodiments of the present disclosure relate to data storage technologies, and in particular, to a data storage method and a phase change memory.

BACKGROUND

A phase change memory (PCM) is a new non-volatile memory that develops fastest currently, which stores corresponding data using different resistance values that a phase change material represents in a crystalline state and in an amorphous state, and is widely applied to compact discs (CD) and digital versatile discs (DVD). Research on high-density storage of the phase change memory is particularly important to adapt to requirements for massive information storage. Traditional methods for implementing a high-density phase change memory include: reducing an area of a phase change unit and reducing an area of a peripheral circuit. The former needs to improve a device structure and is limited by a photoetching size, and the latter needs to optimize design of an integrated circuit.

To overcome the foregoing problem, a multi-valued storage technology emerges. The multi-valued storage technology, different from a traditional binary storage method, can store at-least-two-bit data on a storage unit by fully using a difference between a resistance of a phase change material in a crystalline state and that in an amorphous state. In the prior art, a method for implementing multi-valued storage of a phase change memory generally includes: an erase process (or SET) and a write process (or RESET). The erase process is applying a pulse having a low amplitude and a long pulse width to a storage unit of the phase change memory so that the storage unit changes to a stable low-resistance crystalline state. The write process is applying a pulse having a high amplitude and a narrow pulse width to the storage unit so that the storage unit changes to a high-resistance amorphous state. Because a resistance value of the storage unit of the phase change memory changes according to a width and an amplitude of an applied programmed pulse, amorphous states having different resistance values can be implemented by applying single pulses having different amplitudes and different pulse widths to the storage unit. The amorphous states having different resistance values correspond to different storage states, thereby implementing multi-valued storage of the phase change memory.

The prior art uses a single pulse having a high amplitude and a narrow pulse width to implement multi-valued storage. However, when a single pulse having a high amplitude and a narrow pulse width is applied to a storage unit of a phase change memory, a temperature of the storage unit rises excessively fast, causing a thermal crosstalk problem

SUMMARY

Embodiments of the present disclosure provide a data storage method and a phase change memory, to resolve a thermal crosstalk problem caused during multi-valued storage of a phase change memory in the prior art.

According to a first aspect, an embodiment of the present disclosure provides a data storage method for a phase change memory. The method includes obtaining to-be-stored data, where the to-be-stored data is multi-bit data. The method also includes generating an erase pulse signal and a write pulse signal according to the to-be-stored data, where the write pulse signal is a signal including at least two contiguous pulses, intervals between the at least two contiguous pulses are the same, and the intervals between the at least two contiguous pulses have a value determined according to the to-be-stored data. The method also includes applying the erase pulse signal to a storage unit of the phase change memory so that the storage unit changes to a crystalline state. The method also includes applying the write pulse signal to the storage unit so that the storage unit changes to an amorphous state having a first resistance value, where a magnitude of the first resistance value and the intervals between the at least two contiguous pulses satisfy a particular function relationship, to represent the to-be-stored data using the amorphous state having the first resistance value of the storage unit.

According to the first aspect, in a first possible implementation manner of the first aspect, the method further includes: determining whether the to-be-stored data is maximum data or minimum data in the multi-bit data. The generating an erase pulse signal and a write pulse signal according to the to-be-stored data includes generating the erase pulse signal and the write pulse signal according to the to-be-stored data when the to-be-stored data is not the maximum data or the minimum data in the multi-bit data.

According to the first possible implementation manner of the first aspect, in a second possible implementation manner, the method further includes generating the erase pulse signal according to the to-be-stored data when the to-be-stored data is the maximum data or the minimum data in the multi-bit data, and applying the erase pulse signal to the storage unit of the phase change memory so that the storage unit changes to the crystalline state, to represent the to-be-stored data using the crystalline state of the storage unit.

According to any one of the first aspect to the second possible implementation manner of the first aspect, in a third possible implementation manner, pulse widths of the at least two contiguous pulses are the same.

According to the third possible implementation manner of the first aspect, in a fourth possible implementation manner, the pulse widths of the at least two contiguous pulses range from 30 ns to 50 ns.

According to any one of the first aspect to the fourth possible implementation manner of the first aspect, in a fifth possible implementation manner, the intervals between the at least two contiguous pulses range from 10 ns to 50 ns.

According to any one of the first aspect to the fifth possible implementation manner of the first aspect, in a sixth possible implementation manner, the erase pulse signal and the write pulse signal are voltage signals; or the erase pulse signal and the write pulse signal are current signals.

According to the sixth possible implementation manner of the first aspect, in a seventh possible implementation manner, the write pulse signal is a voltage signal including at least two contiguous pulses, and amplitudes of the at least two contiguous pulses range from 1 V to 1.5 V.

According to a second aspect, an embodiment of the present disclosure further provides a control apparatus for a phase change memory. The apparatus includes an obtaining module, configured to obtain to-be-stored data, where the to-be-stored data is multi-bit data. The apparatus also includes a generation module, configured to generate an erase pulse signal and a write pulse signal according to the to-be-stored data, where the write pulse signal is a signal including at least two contiguous pulses, intervals between the at least two contiguous pulses are the same, and the intervals between the at least two contiguous pulses have a value determined according to the to-be-stored data. The apparatus also includes a control module, configured to apply the erase pulse signal to a storage unit of the phase change memory so that the storage unit changes to a crystalline state, and apply the write pulse signal to the storage unit so that the storage unit changes to an amorphous state having a first resistance value, where a magnitude of the first resistance value and the intervals between the at least two contiguous pulses satisfy a particular function relationship, to represent the to-be-stored data using the amorphous state having the first resistance value of the storage unit.

According to the second aspect, in a first possible implementation manner of the second aspect, the control apparatus further includes a determining module, configured to determine whether the to-be-stored data is maximum data or minimum data in the multi-bit data. The generation module is further configured to generate the erase pulse signal and the write pulse signal according to the to-be-stored data when the to-be-stored data is not the maximum data or the minimum data in the multi-bit data.

According to the first possible implementation manner of the second aspect, in a second possible implementation manner, the generation module is further configured to generate the erase pulse signal according to the to-be-stored data when the to-be-stored data is the maximum data or the minimum data in the multi-bit data. The control module is further configured to apply the erase pulse signal to the storage unit of the phase change memory so that the storage unit changes to the crystalline state, to represent the to-be-stored data using the crystalline state of the storage unit.

According to a third aspect, an embodiment of the present disclosure further provides a control apparatus for a phase change memory, including: a processor and a communications bus, where the processor is connected to the communications bus, and the communications bus is connected to a storage unit of the phase change memory. The processor is configured to execute any data storage method for a phase change memory described above, and control data storage by the storage unit using the communications bus.

According to a fourth aspect, an embodiment of the present disclosure further provides a computer readable medium, including a computer execution instruction, to be invoked and executed by a processor of a computer, where the computer execution instruction includes a computer instruction corresponding to any data storage method for a phase change memory described above.

According to the data storage method and the control apparatus for a phase change memory provided in the embodiments of the present disclosure, a write pulse signal including at least two contiguous pulses is generated according to to-be-stored data, and the write pulse signal is applied to a storage unit of the phase change memory so that the storage unit changes to an amorphous state having a resistance value corresponding to the to-be-stored data, to represent the to-be-stored data, implementing multi-valued storage by a single storage unit. The write pulse signal includes the at least two contiguous pulses, which can lower a temperature increase of the storage unit caused by applying a pulse once and ease a thermal crosstalk problem caused by excessive heat

BRIEF DESCRIPTION OF THE DRAWINGS

To describe the technical solutions in the embodiments of the present more clearly, the following briefly describes the accompanying drawings required for describing the embodiments or the prior art. Apparently, the accompanying drawings in the following description show some embodiments of the present disclosure.

DETAILED DESCRIPTION OF ILLUSTRATIVE EMBODIMENTS

To make the objectives, technical solutions, and advantages of the embodiments of the present disclosure clearer, the following describes the technical solutions in the embodiments of the present disclosure with reference to the accompanying drawings in the embodiments of the present disclosure. Apparently, the described embodiments are some but not all of the embodiments of the present disclosure.

Figure 1:
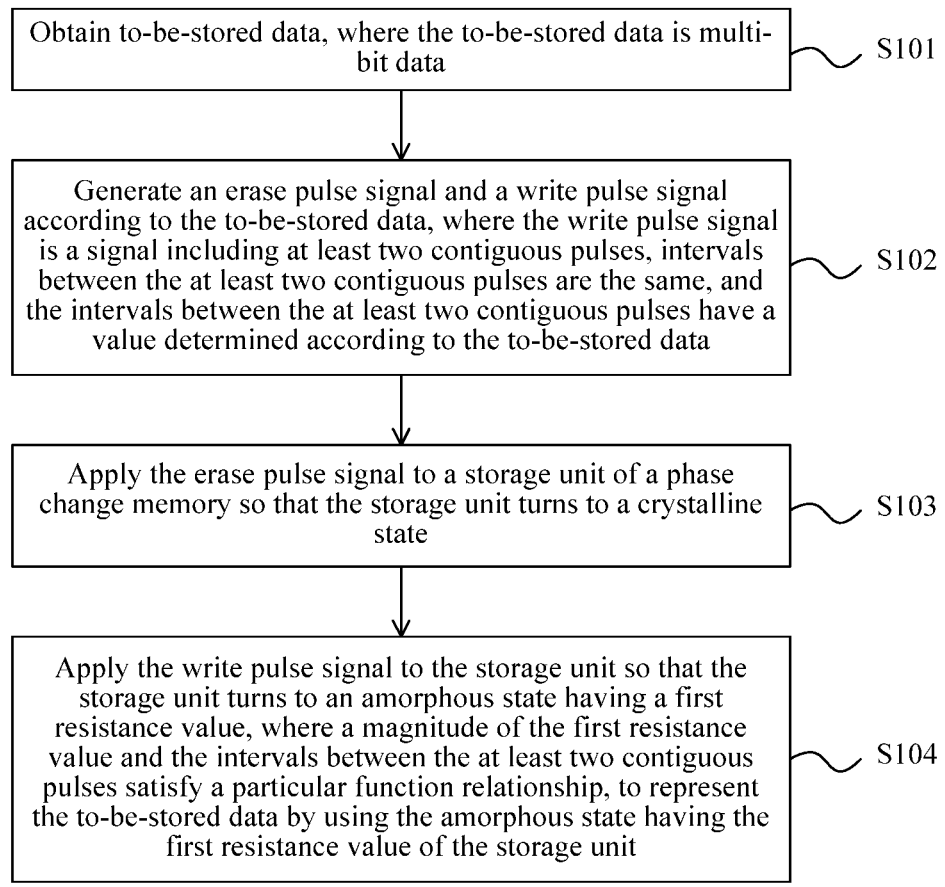
FIG. 1 is a flowchart of a data storage method for a phase change memory according to Embodiment 1 of the present disclosure.

An embodiment provides a storage method for a phase change memory. The method includes generating a write pulse signal according to multi-bit to-be-stored data, where the write pulse signal is a signal including at least two contiguous pulses, intervals between the at least two contiguous pulses are the same, and the intervals between the at least two contiguous pulses need to be determined according to the multi-bit to-be-stored data. The method also includes applying the write pulse signal to a storage unit, so that the storage unit may change to an amorphous state having a first resistance value, where a magnitude of the first resistance value is related to the intervals between the at least two contiguous pulses. Therefore, the storage unit may obtain amorphous states having different resistance values using write pulse signals that have different intervals and that each include at least two contiguous pulses, to separately record different multi-bit data, implementing multi-valued storage by a single storage unit. In the foregoing process, because the write pulse signal is a signal including at least two contiguous pulses, an amplitude of the write pulse signal can be effectively reduced, and a temperature increase of the storage unit caused by applying a pulse once can be lowered, thereby resolving a thermal crosstalk problem in the prior art that is caused by multi-valued storage implemented using a single pulse having a high amplitude and a narrow pulse width. FIG. 1 is a data storage method for a phase change memory according to Embodiment 1 of the present disclosure. As shown in FIG. 1, the method specifically includes steps as follows:

Step 101: Obtain to-be-stored data, where the to-be-stored data is multi-bit data.

The multi-bit data may be multi-bit binary data. The to-be-stored data may be received data input from the outside, may be data pre-configured inside a storage unit of the phase change memory, or may be data generated according to a pre-configured data generation rule. If the to-be-stored data is n-bit data, the to-be-stored data may be any one of $2^n$ pieces of data.

Step 102: Generate an erase pulse signal and a write pulse signal according to the to-be-stored data, where the write pulse signal is a signal including at least two contiguous pulses, intervals between the at least two contiguous pulses are the same, and the intervals between the at least two contiguous pulses have a value determined according to the to-be-stored data.

In this embodiment of the present disclosure, the storage unit of the phase change memory may be used to represent different to-be-stored data when having different resistance values. A resistance value of the storage unit is closely related to an amorphization degree of a phase change material layer of the storage unit, the amorphization degree depends on a temperature of the phase change material layer, and a phase change material may be heated to different temperatures by applying electrical pulses having different parameters. Therefore, write pulse signals that have different intervals and that each include at least two contiguous pulses may be generated according to different to-be-stored data so that the storage unit changes to amorphous states having resistance values, to store different to-be-stored data and implement multi-valued storage. When the write pulse signal is a signal including at least two contiguous pulses, a temperature increase of the storage unit caused by applying a pulse once can be lowered, thereby resolving a thermal crosstalk problem in the prior art that is caused by multi-valued storage implemented using a single pulse having a high amplitude and a narrow pulse width.

Specifically, the intervals between the at least two contiguous pulses may be the same, and the intervals between the at least two contiguous pulses may be determined according to the to-be-stored data. For example, a preset interval range may be equally divided into $2^n$ parts, and the intervals between the at least two contiguous pulses are determined according to a magnitude location of the to-be-stored data in the $2^n$ pieces of data. That is, intervals between at least two contiguous pulses in write pulse signals corresponding to adjacent to-be-stored data are intervals corresponding to adjacent equally divided parts. It should be noted that in an actual application situation, the intervals between the at least two contiguous pulses corresponding to the adjacent to-be-stored data need to be fine-tuned according to a quantity of the at least two contiguous pulses, and a pulse width and a pulse amplitude of a single pulse. Specifically, if the quantity of the at least two contiguous pulses is relatively large, corresponding amplitudes are relatively small. Correspondingly, if the quantity of the at least two contiguous pulses is relatively small, corresponding pulse intervals are relatively small, to reduce a loss of heat and fully use heat generated by the pulses. If the pulse width of the single pulse is relatively narrow, a corresponding pulse interval is relatively small. If a pulse amplitude is relatively small, a corresponding pulse interval is relatively small.

For another example, the intervals between the at least two contiguous pulses may have a value obtained according to the to-be-stored data using a table of correspondence between preset data and a pulse interval. If the to-be-stored data is n-bit data, the table of correspondence between preset data and a pulse interval includes at least pulse intervals respectively corresponding to $2^n$ pieces of data. As regards specific values of the pulse intervals respectively corresponding to the $2^n$ pieces of data in the table of correspondence between preset data and a pulse interval, before step 102, a test experiment may be separately performed on all data of the to-be-stored data according to a quantity of bits of the to-be-stored data, to obtain pulse intervals required by corresponding resistance values of amorphous states for storing the data, and store the to-be-stored data and pulses corresponding to the to-be-stored data, to obtain the table of correspondence between data and a pulse interval.

Step 103: Apply the erase pulse signal to a storage unit of the phase change memory so that the storage unit changes to a crystalline state.

In an initial state, the storage unit is mostly in an amorphous state. In order to ensure stability and accuracy of a resistance value of an amorphous state representing the to-be-stored data, the erase pulse signal needs to be applied to the storage unit so that the storage unit changes to a stable crystalline state. Generally, a resistance value of the storage unit in the crystalline state is less than a resistance value of the storage unit in an amorphous state.

Specifically, the erase pulse signal may include at least one signal having a low amplitude and a long pulse width. If the erase pulse signal is a signal including one pulse, an amplitude of the pulse may be less than a preset amplitude, where the preset amplitude may be a corresponding pulse amplitude obtained when the phase change material layer of the storage unit is heated to a melting-point temperature. A pulse width of the erase pulse signal is greater than time required to heat the phase change material layer of the storage unit to a crystallization temperature according to the pulse whose amplitude is less than the preset amplitude. The amplitude of the pulse included in the erase pulse signal may range from 0.5 v to 1.5 V, and the pulse width of the pulse included in the erase pulse signal may range from 100 ns to 300 ns. Because heat required to heat the phase change material layer of the storage unit to the melting-point temperature is fixed, if the erase pulse signal includes at least two contiguous pulses, amplitudes of pulses included in the erase pulse signal are less than the corresponding amplitude obtained when the erase pulse signal includes one pulse. An amplitude of a pulse included in the erase pulse signal and a specific quantity of pulses included in the erase pulse signal may be determined according to a material of the phase change material layer of the storage unit or an internal structure of the storage unit. For example, if the erase pulse signal is a signal including one pulse, the erase pulse signal may be a signal including an electrical pulse having an amplitude of 0.8 v and a pulse width of 300 ns.

Step 104: Apply the write pulse signal to the storage unit so that the storage unit changes to an amorphous state having a first resistance value, where a magnitude of the first resistance value and the intervals between the at least two contiguous pulses satisfy a particular function relationship, to represent the to-be-stored data using the amorphous state having the first resistance value of the storage unit.

The write pulse signal is applied to the storage unit so that the phase change material layer changes to the amorphous state having the first resistance value. Specifically, the phase change material layer of the storage unit is heated using joule heat generated by the write pulse signal, and the phase change material layer is heated to over the melting-point temperature and is fast cooled to below the crystallization temperature, so that the phase change material layer changes to the amorphous state having the first resistance value, where the magnitude of the first resistance value and the intervals between the at least two contiguous pulses satisfy the particular function relationship. In the case, the first resistance value is greater than the resistance value of the storage unit in the crystalline state.

Specifically, a resistance value R of an amorphous state of the storage unit and an amorphization rate $C_a$ of the phase change material layer are closely related and satisfy the following formula (1): $R=(1-C_a)R_{c0}+C_aR_{a0}$ (1). In the formula (1), R represents a resistance value of an amorphous state of the storage unit, $C_a$ represents an amorphization rate of the phase change material layer, and $R_{c0}$ and $R_{a0}$ are respectively resistance values of the storage unit in a complete crystalline state and in a complete amorphous state. A phase change material layer of a particular material has fixed $R_{c0}$ and $R_{a0}$, which may be obtained in advance according to an experiment.

The amorphization rate $C_a$ is actually a ratio of a volume $V_a$ of an amorphization area of the phase change material layer to a total volume $V_{GST}$ of the phase change material layer and may be represented by the following formula (2):

$$C_a = \frac{\int V_a dt}{V_{GST}}. \quad (2)$$

The volume $V_a$ of the amorphization area of the phase change material layer may be determined according to a critical temperature $T_a$ of crystallization and amorphization of the phase change material layer and a melting-point temperature $T_m$ of the phase change material layer using the following formula (3):

$$\frac{dV_a}{dt} = \left(\frac{dV_a}{dt}\right)_c \theta(T_m - T_a) + \left(\frac{dV_a}{dt}\right)_a \theta(T_a - T_m). \quad (3)$$

A material of a phase change material layer of a storage unit of a particular phase change memory is known and determined. Therefore, the melting-point temperature $T_m$ of the phase change material layer is known.

The critical temperature $T_a$ of crystallization and amorphization of the phase change material layer may be obtained according to heat applied to the phase change material layer, that is, joule heat generated by an applied write pulse signal, using the following formula (4):

$$T_a = \int \frac{W_j - W_d}{C} dt. \quad (4)$$

$W_d$ is dissipation power, that is, a power loss, and $W_j$ is joule heat generated by an applied write pulse signal and may be obtained according to a parameter such as intervals between at least two contiguous pulses in the write pulse signal. Therefore, the resistance value of the amorphous state of the storage unit, that is, the magnitude of the first resistance value, and the intervals between the at least two contiguous pulses in the applied write pulse signal satisfy the function relationship.

Specifically, because the intervals between the at least two contiguous pulses in the write pulse signal are determined according to the to-be-stored data, intervals between at least two contiguous pulses in write pulse signals corresponding to different to-be-stored data are different. Heat generated by applying write pulse signals having different pulse intervals to the storage unit is different, temperatures to which the phase change material layer of the storage unit is heated are necessarily different, and resistance values of amorphous states obtained at different temperatures are different. The storage unit having amorphous states having different resistance values may be separately configured to represent different to-be-stored data. Resistance values of amorphous states that are obtained by applying write pulse signals having different pulse intervals to the storage unit and that correspond to the storage unit are different; a difference between resistance values corresponding to adjacent pulse intervals is relatively large and exceeds a preset threshold.

Amplitudes of the at least two contiguous pulses are greater than an amplitude of the erase pulse signal, and a pulse width of the at least two contiguous pulses is less than a pulse width of the erase pulse signal. In the solution of this embodiment, the amplitudes of the at least two contiguous pulses may be greater than the preset amplitude, and the preset amplitude may be a corresponding pulse amplitude obtained when the phase change material layer of the storage unit is heated to the melting-point temperature.

Because the heat required to heat the phase change material layer of the storage unit to the melting-point temperature is fixed, the amplitude of the write pulse signal including at least two contiguous pulses is necessarily less than an amplitude of a write pulse signal including a single pulse. Therefore, when the write pulse signal is applied to the storage unit, a temperature increase of the storage unit caused by applying a pulse once is lowered, thereby easing or avoiding a thermal crosstalk problem caused by excessive heat.

Intervals exist between the at least two contiguous pulses, and intervals between adjacent pulses are the same, and may be, for example, 50 ns. Because the intervals exist between the at least two contiguous pulses, when the write pulse signal is applied to the storage unit, the storage unit may fully use heat generated by applying the foregoing pulses. Therefore, a sum of the amplitudes of the at least two contiguous pulses is less than an amplitude of the write pulse signal including a single pulse. That is, when the write pulse signal is applied to the storage unit, total energy required to apply the write pulse signal may be further reduced, thereby lowering power consumption.

In the solution of this embodiment, any to-be-stored data may be represented using an amorphous body having a particular resistance value obtained by applying an erase pulse signal and a write pulse signal. That is, in the solution of this embodiment, the storage unit may not store any data using the crystalline state.

In the solution of this embodiment, corresponding data may be stored and recorded according to a magnitude of a resistance value or a current value of the storage unit. In the solution, a larger resistance value of the storage unit or a smaller the current value may indicate large or small data that is stored and recorded. Specifically, a correspondence between the resistance value or the current value of the storage unit and the magnitude of the data stored and recorded in the storage unit may be pre-configured.

It should be noted that smaller intervals between the at least two contiguous pulses indicate that the resistance value of the amorphous state obtained by the storage unit when the at least two contiguous pulses are applied to the storage unit is larger.

In the solution of this embodiment, a write pulse signal that is determined according to multi-bit to-be-stored data is applied to a storage unit, so that the storage unit changes to an amorphous state having a resistance value corresponding to the to-be-stored data, to represent the to-be-stored data, implementing multi-valued storage by a single storage unit. The write pulse signal includes at least two contiguous pulses, which lowers a temperature increase of the storage unit caused by applying a pulse once and eases or avoids a thermal crosstalk problem caused by excessive heat.

Besides, the at least two contiguous pulses are used, which lowers an amplitude of the write pulse signal and reduces difficulty of amplitude control by a pulse generation circuit on the write pulse signal. Because there are relatively few adjustment parameters, resistance values of different amorphous states of the storage unit are better controlled, improving stability of storing multiple pieces of data using the storage unit. Because write pulse signals for different to-be-stored data are different only in intervals between at least two contiguous pulses, the pulse generation circuit has a simple structure. Besides, because a write pulse includes at least two contiguous pulses, heat generated by the applied pulses is fully used, which can further lower control power consumption and save energy.

Figure 2:
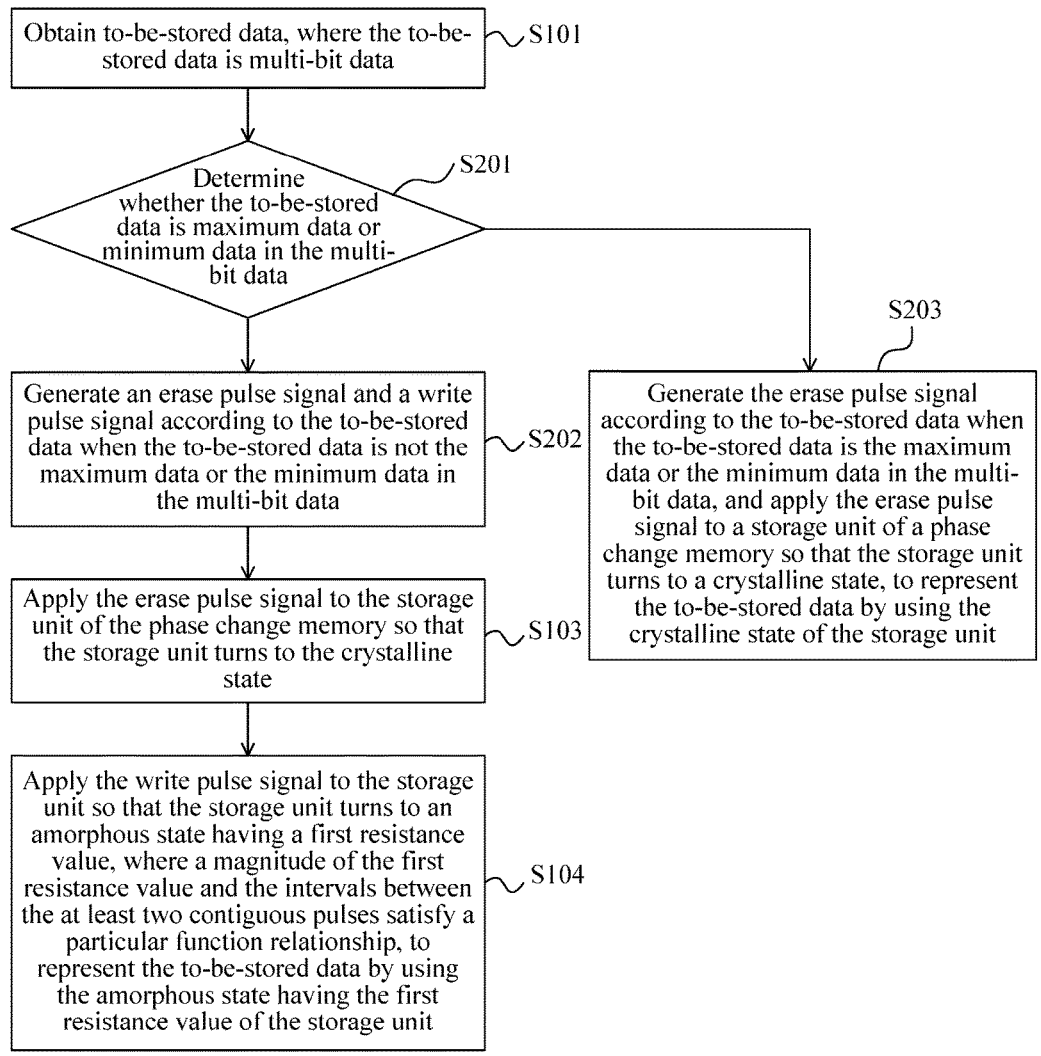
FIG. 2 is a flowchart of a data storage method for a phase change memory according to Embodiment 2 of the present disclosure.

An embodiment further provides a data storage method for a phase change memory. In the solution of this embodiment, a crystalline state of the phase change memory may be used to store a part of data, and amorphous states having different resistance values of the phase change memory are used to store remaining data. The part of data that may be stored using the crystalline state may be maximum data or minimum data in multi-bit data. If the part of data is the maximum data in the multi-bit data, the remaining data stored using the amorphous states having different resistance values is other data in the multi-bit data except the maximum data. If the part of data is the minimum data in the multi-bit data, the remaining data stored by amorphous states having different resistance values is other data in the multi-bit data except the minimum data. FIG. 2 is a flowchart of a data storage method for a phase change memory according to Embodiment 2 of the present disclosure. As shown in FIG. 2, before step 102 of generating an erase pulse signal and a write pulse signal according to the to-be-stored data in the foregoing solution, the solution further includes the following steps.

Step 201: Determine whether the to-be-stored data is maximum data or minimum data in the multi-bit data.

If the to-be-stored data is two-bit data, 00 in the two-bit data is minimum data, and 11 is maximum data. Step 201 is actually determining whether the to-be-stored data is 00 or 11.

Preferably, step 102 of generating an erase pulse signal and a write pulse signal according to the to-be-stored data specifically includes the following steps.

Step 202: Generate the erase pulse signal and the write pulse signal according to the to-be-stored data when the to-be-stored data is not the maximum data or the minimum data in the multi-bit data.

It should be noted that steps 103 and 104 further need to be performed after step 202, to represent the to-be-stored data using the amorphous state having the first resistance value.

In the solution of this embodiment, as regards non-maximum data or non-minimum data in the multi-bit data, corresponding to-be-stored data is represented using an amorphous body having a particular resistance value obtained by applying an erase pulse signal and a write pulse signal.

Based on the foregoing solution, further, the method further includes the following steps.

Step 203: Generate the erase pulse signal according to the to-be-stored data when the to-be-stored data is the maximum data or the minimum data in the multi-bit data, and apply the erase pulse signal to the storage unit of the phase change memory so that the storage unit changes to a crystalline state, to represent the to-be-stored data using the crystalline state of the storage unit.

As regards the maximum data or the minimum data in the multi-bit data, the maximum data or the minimum data may be represented using the crystalline state obtained by applying only the write pulse signal. That is, in the solution of this embodiment, the crystalline state of the storage unit may store the maximum data or the minimum data in the multi-bit data.

It should be noted that if the maximum data is represented using the crystalline state, the minimum data further needs to be represented using an amorphous state having a corresponding resistance value obtained by generating a corresponding write pulse signal according to the minimum data and then applying the write pulse signal; correspondingly, if the minimum data is represented using the crystalline state, the maximum data further needs to be represented using an amorphous state having a corresponding resistance value obtained by generating a corresponding write pulse signal and then applying the write pulse signal.

Whether the crystalline state of the storage unit represents the maximum data or the minimum data may be specifically determined according to a pre-determined data storage rule. If the data storage rule is sequentially storing pieces of the multi-bit data from small to large according to an ascending order of resistance values of the storage unit, the minimum data is represented using the crystalline state; if the data storage rule is sequentially storing pieces of the multi-bit data from small to large according to an ascending order of internal current values when the storage unit is powered on, the maximum data is represented using the crystalline state.

Preferably, in the solution of any embodiment above, pulse widths of the at least two contiguous pulses are the same.

Further, the pulse widths of the at least two contiguous pulses range from 30 ns to 50 ns.

Specifically, a corresponding pulse width may be selected within the pulse width range according to a structure of the phase change material layer of the storage unit and/or a structure of the storage unit.

Based on the foregoing solution, the intervals between the at least two contiguous pulses range from 10 ns to 50 ns.

Specifically, in order to ensure that resistance values of amorphous states of the storage unit that correspond to write pulse signals having different pulse intervals are different, to help read and distinguish the different resistance values, so as to ensure stability of different stored multi-bit data, preferably, the different pulse intervals may be 10 ns, 15 ns, 25 ns, 30 ns, 40 ns, 45 ns, and 50 ns. Assuming that the to-be-stored data is two-bit data, that is, any one of four pieces of data: 00, 01, 10, and 11, preferably, intervals between at least two contiguous pulses in write pulse signals determined according to the four pieces of data may be 50 ns, 40 ns, 25 ns, and 10 ns.

If the write pulse signals having the four different pulse intervals are applied to the storage unit, four different amorphous states may be separately obtained, and the four different amorphous states separately have different resistance values. A write pulse signal having a smaller pulse interval corresponds to a larger resistance value of an amorphous state, and a smaller current value. That is, when a write pulse signal having a pulse interval of 10 ns is applied to the storage unit, an obtained resistance value of an amorphous state of the storage unit is maximum. It is assumed that the storage unit separately stores data from small to large according to an ascending order of current values, that is, a descending order of resistance values. If the to-be-stored data is 00, it may be determined, according to the to-be-stored data, that a pulse interval of the write pulse signal is 10 ns, and then the write pulse signal is applied to the storage unit so that the storage unit may change to an amorphous state having a resistance value of 1 MΩ. If the to-be-stored data is 01, it may be determined, according to the to-be-stored data, that a pulse interval of the write pulse signal is 25 ns, and then the write pulse signal is applied to the storage unit so that the storage unit may change to an amorphous state having a resistance value of 100 KΩ. If the to-be-stored data is 10, it may be determined, according to the to-be-stored data, that a pulse interval of the write pulse signal is 40 ns, and then the write pulse signal is applied to the storage unit so that the storage unit may change to an amorphous state having a resistance value of 10 KΩ. If the to-be-stored data is 11, it may be determined, according to the to-be-stored data, that a pulse interval of the write pulse signal is 50 ns, and then the write pulse signal is applied to the storage unit so that the storage unit may change to an amorphous state having a resistance value of 10Ω.

Furthermore, the erase pulse signal and the write pulse signal are voltage signals; or the erase pulse signal and the write pulse signal are current signals.

If the write pulse signal is a voltage signal including at least two contiguous pulses, and amplitudes of the at least two contiguous pulses preferably range from 1 V to 1.5 V.

Specifically, amplitudes of the at least two contiguous pulses are the same. A pulse generation structure can be simplified using a write pulse signal including at least two contiguous pulses having a same amplitude. The amplitudes of the at least two contiguous pulses are the same and may be both 1.27 V.

Figure 3:
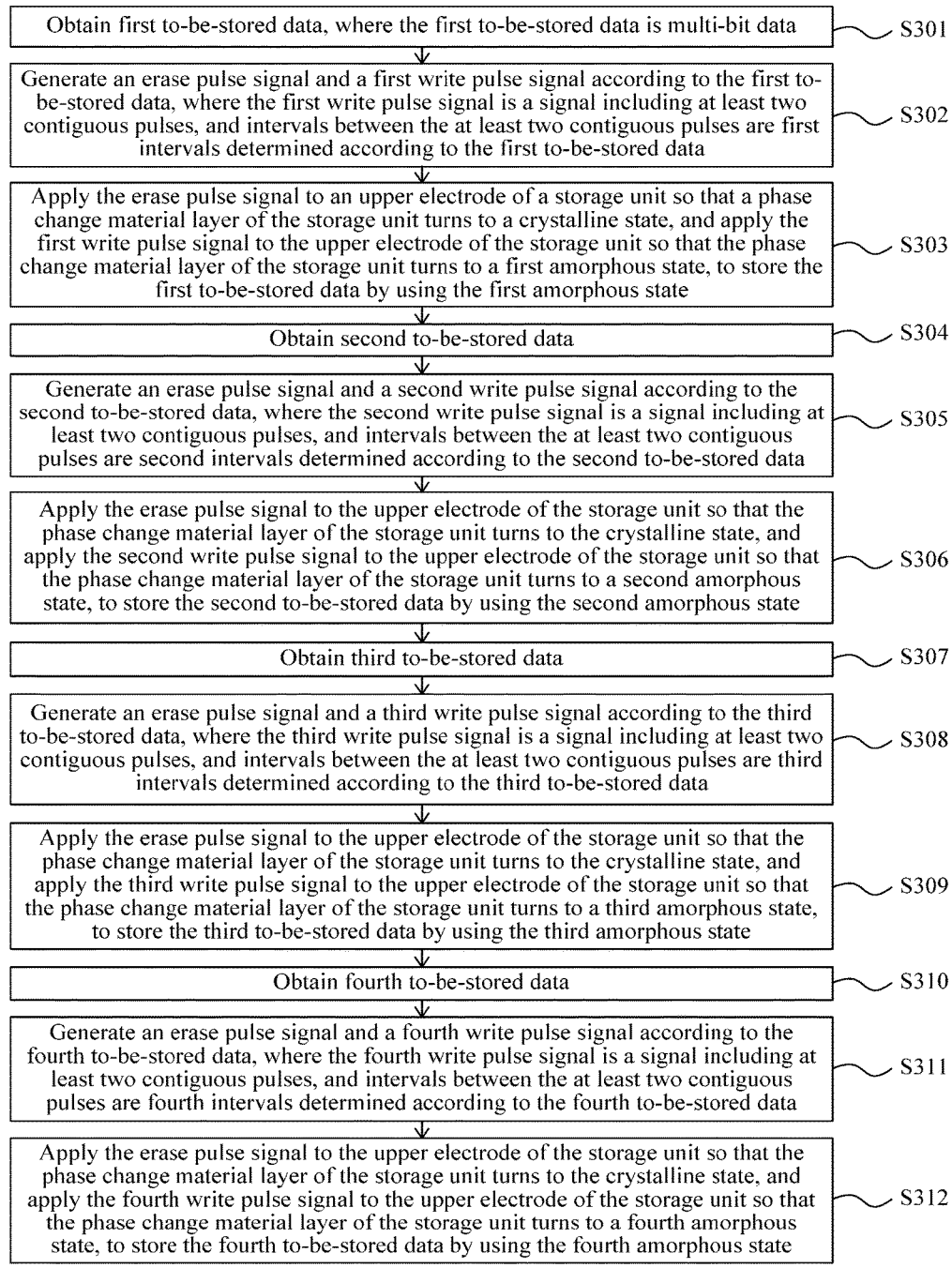
FIG. 3 is a flowchart of a data storage method for a phase change memory according to Embodiment 3 of the present disclosure.

An embodiment further provides a data storage method for a phase change memory. In this embodiment, the solutions of the foregoing embodiments are described using specific examples. FIG. 3 is a flowchart of a data storage method for a phase change memory according to Embodiment 3 of the present disclosure. As shown in FIG. 3, the method specifically includes as follows:

Step 301: Obtain first to-be-stored data, where the first to-be-stored data is multi-bit data.

The to-be-stored data may be obtained according to a pre-configured data generation rule. In this embodiment, the storage unit may store two-bit data, the data generation rule may be a rule of generation in an ascending order of magnitudes of data, and the first to-be-stored data may be 00.

Step 302: Generate an erase pulse signal and a first write pulse signal according to the first to-be-stored data, where the first write pulse signal is a signal including at least two contiguous pulses, and intervals between the at least two contiguous pulses are first intervals determined according to the first to-be-stored data.

If the first write pulse signal and the erase pulse signal are voltage signals, the erase pulse signal may be an electrical pulse having an amplitude of 0.8 v and a pulse width of 300 ns. The first write pulse signal is a signal including two contiguous pulses having an amplitude of 1.27 v and a pulse width of 30 ns. The first interval may be 50 ns.

Step 303: Apply the erase pulse signal to an upper electrode of a storage unit so that a phase change material layer of the storage unit changes to a crystalline state, and apply the first write pulse signal to the upper electrode of the storage unit so that the phase change material layer of the storage unit changes to a first amorphous state, to store the first to-be-stored data using the first amorphous state.

Figure 4:
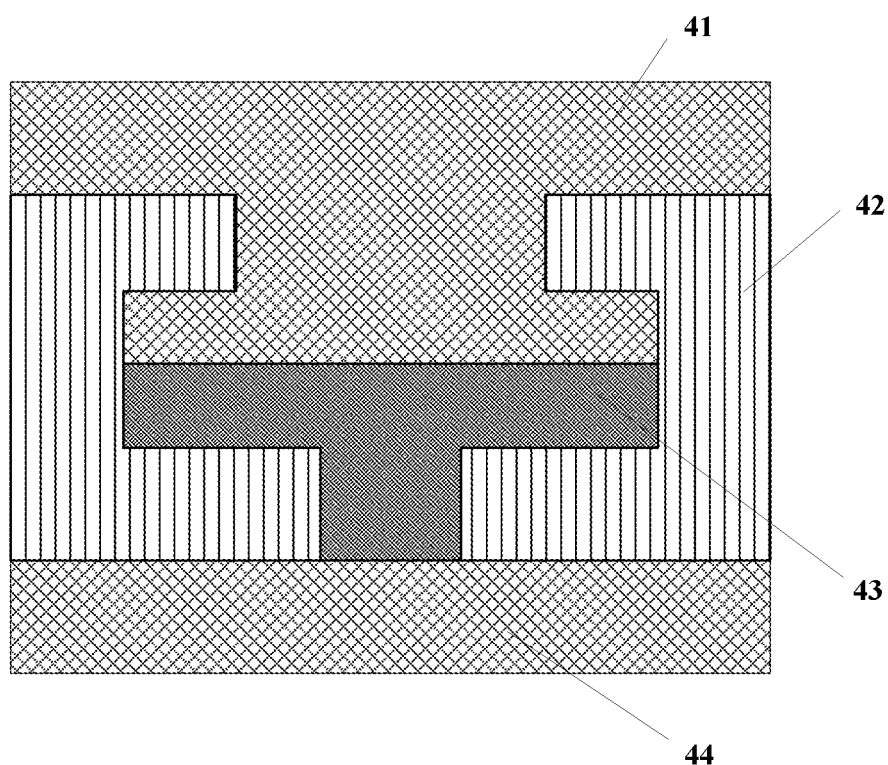
FIG. 4 is a schematic structural diagram of a storage unit of a phase change memory.

FIG. 4 is a schematic structural diagram of the storage unit of the phase change memory. As shown in FIG. 4, the storage unit includes: an upper electrode 41, a lower electrode 44, a phase change material layer 42, and an insulation layer 43. The upper electrode 41 and the lower electrode 44 are both made of a conductive material, such as metal aluminum electrodes. The phase change material layer 42 is a GST material. The upper electrode 41 may receive an applied erase pulse signal or write pulse signal by connecting to a signal source of a controller. The lower electrode 42 may be grounded by selecting a transistor.

When the upper electrode 41 of the storage unit is connected to an output end of a pulse generation circuit, after the erase pulse signal is received, the phase change material layer 42 may be heated using the erase pulse signal, where joule heat is generated to increase a temperature of the phase change material layer 42 to over a crystallization temperature of the phase change material layer 42 and below a melting-point temperature. In this embodiment, the crystallization temperature may be, for example, 400 k, and the melting-point temperature is 600 k. After the erase pulse signal is applied, the phase change material layer of the storage unit changes to a crystalline state having a resistance value of 10Ω.

The write pulse signal having the first interval is applied to the upper electrode 41 of the storage unit, the phase change material layer 42 is heated using joule heat generated by the write pulse signal, and the phase change material layer 42 is heated to over the melting-point temperature and is fast cooled to below the crystallization temperature, so that the phase change material layer 42 changes to an amorphous state having a first resistance value.

The write pulse signal having the first interval is applied to the phase change material layer of the storage unit so that the storage unit changes to an amorphous state having 1000 KΩ. That is, the first resistance value may be 1000 KΩ.

Step 304: Obtain second to-be-stored data.

The second to-be-stored data may be 01.

Step 305: Generate an erase pulse signal and a second write pulse signal according to the second to-be-stored data, where the second write pulse signal is a signal including at least two contiguous pulses, and intervals between the at least two contiguous pulses are second intervals determined according to the second to-be-stored data.

The second interval may be 40 ns. A pulse width and an amplitude of the second write pulse signal may be the same as those of the first write pulse signal. The erase pulse signal may be the same as the foregoing erase pulse signal.

Step 306: Apply the erase pulse signal to the upper electrode of the storage unit so that the phase change material layer of the storage unit changes to the crystalline state, and apply the second write pulse signal to the upper electrode of the storage unit so that the phase change material layer of the storage unit changes to a second amorphous state, to store the second to-be-stored data using the second amorphous state.

The second write pulse signal is applied to the upper electrode of the storage unit so that the phase change material layer of the storage unit may change to the second amorphous state, such as an amorphous state having a resistance value of 100 KΩ.

Step 307: Obtain third to-be-stored data.

The third to-be-stored data may be 10.

Step 308: Generate an erase pulse signal and a third write pulse signal according to the third to-be-stored data, where the third write pulse signal is a signal including at least two contiguous pulses, and intervals between the at least two contiguous pulses are third intervals determined according to the third to-be-stored data.

The third interval may be 25 ns. A pulse width and an amplitude of the third write pulse signal may be the same as those of the first write pulse signal. The erase pulse signal may be the same as the foregoing erase pulse signal and is an electrical pulse having an amplitude of 0.8 v and a pulse width of 300 ns.

Step 309: Apply the erase pulse signal to the upper electrode of the storage unit so that the phase change material layer of the storage unit changes to the crystalline state, and apply the third write pulse signal to the upper electrode of the storage unit so that the phase change material layer of the storage unit changes to a third amorphous state, to store the third to-be-stored data using the third amorphous state.

The third write pulse signal having an interval of 25 ns is applied to the upper electrode of the storage unit so that the phase change material layer of the storage unit may change to the third amorphous state, such as an amorphous state having a resistance value of 10 KΩ.

Step 310: Obtain fourth to-be-stored data.

The fourth to-be-stored data may be 11.

Step 311: Generate an erase pulse signal and a fourth write pulse signal according to the fourth to-be-stored data, where the fourth write pulse signal is a signal including at least two contiguous pulses, and intervals between the at least two contiguous pulses are fourth intervals determined according to the fourth to-be-stored data.

The fourth interval may be 10 ns. A pulse width and an amplitude of the fourth write pulse signal may be the same as those of the first write pulse signal. The erase pulse signal may be the same as the foregoing erase pulse signal.

Step 312: Apply the erase pulse signal to the upper electrode of the storage unit so that the phase change material layer of the storage unit changes to the crystalline state, and apply the fourth write pulse signal to the upper electrode of the storage unit so that the phase change material layer of the storage unit changes to a fourth amorphous state, to store the fourth to-be-stored data using the fourth amorphous state.

The write pulse signal having an interval of 10 ns is applied to the upper electrode of the storage unit so that the phase change material layer of the storage unit may change to the fourth amorphous state, such as an amorphous state having a resistance value of 10Ω.

In this embodiment, the storage unit may have four amorphous states that have different resistance values and a crystalline state. The amorphous states of the storage unit are sequentially the first amorphous state, the second amorphous state, the third amorphous state, and the fourth amorphous state from small to large according to the different resistance values. The first amorphous state, the second amorphous state, the third amorphous state, and the fourth amorphous state of the storage unit may respectively store 00, 01, 10, and 11, to store four pieces of two-bit data.

The write pulse signal including two same pulses in this embodiment is only a preferred solution in solutions of this embodiment, the present disclosure is not limited thereto, and the solution may also be implemented by a combination of more than two same pulses.

Specifically, in this embodiment, a write pulse signal whose intervals between at least two contiguous pulses are determined according to to-be-stored data is applied to a storage unit so that the storage unit changes to an amorphous state having a resistance value corresponding to the to-be-stored data, to store the corresponding to-be-stored data, implementing multi-bit data storage by a single storage unit. Multi-bit data storage by a single storage unit is implemented using a write pulse signal including at least two contiguous pulses, thereby improving a storage density of the storage unit. Besides, because there are relatively few adjustment parameters, resistance values of different amorphous states of the storage unit can be better controlled, improving stability of storing multiple pieces using the storage unit.

Figure 5:
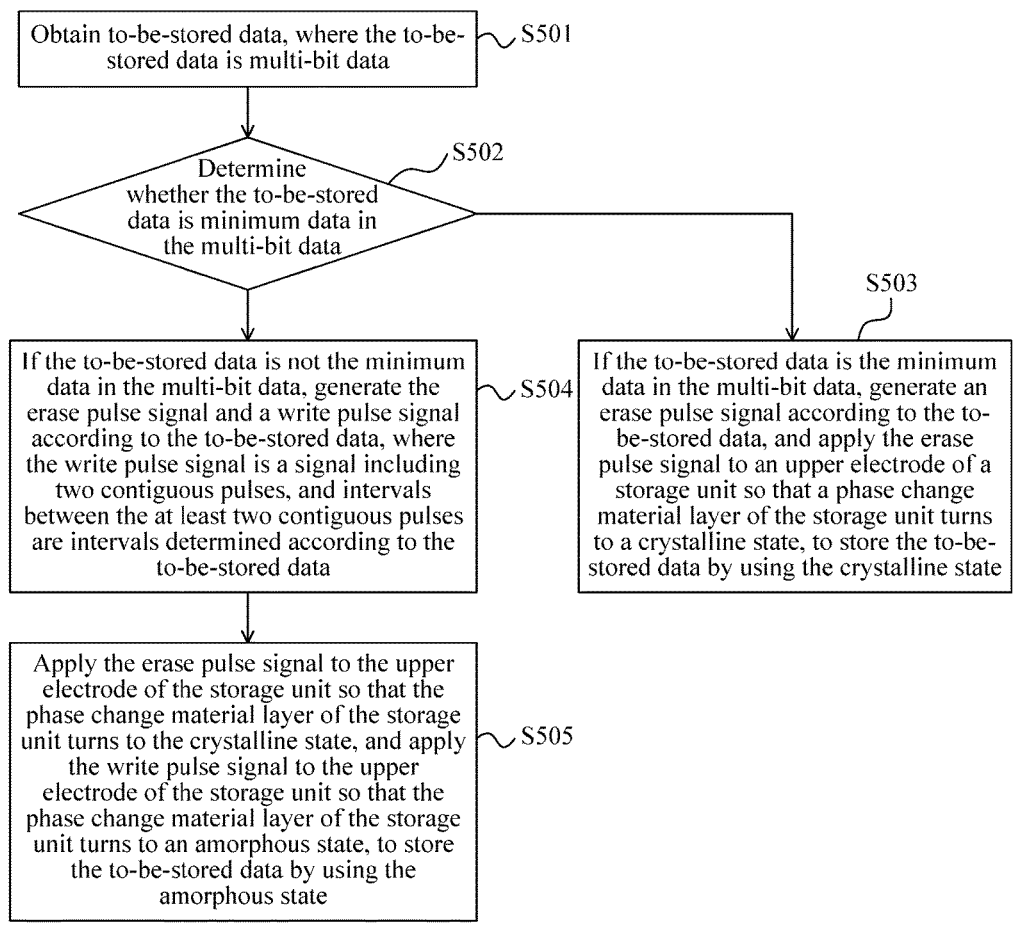
FIG. 5 is a flowchart of a data storage method for a phase change memory according to Embodiment 4 of the present disclosure.

An embodiment further provides a data storage method for a phase change memory. In this embodiment, the solutions of the foregoing embodiments are described using specific examples. FIG. 5 is a flowchart of a data storage method for a phase change memory according to Embodiment 4 of the present disclosure. As shown in FIG. 5, the method specifically includes the following steps.

Step 501: Obtain to-be-stored data, where the to-be-stored data is multi-bit data.

Step 502: Determine whether the to-be-stored data is minimum data in the multi-bit data.

The to-be-stored data may be obtained according to a pre-configured data generation rule or may be obtained data input by an external input device. The determining whether the to-be-stored data is minimum data in the multi-bit data is actually determining whether each bit of the to-be-stored data is 0. If each bit of the to-be-stored data is 0, the to-be-stored data is the minimum data in the multi-bit data.

Step 503: If the to-be-stored data is the minimum data in the multi-bit data, generate an erase pulse signal according to the to-be-stored data, and apply the erase pulse signal to an upper electrode of a storage unit so that a phase change material layer of the storage unit changes to a crystalline state, to store the to-be-stored data using the crystalline state.

Step 504: If the to-be-stored data is not the minimum data in the multi-bit data, generate the erase pulse signal and a write pulse signal according to the to-be-stored data, where the write pulse signal is a signal including two contiguous pulses, and intervals between the at least two contiguous pulses are intervals determined according to the to-be-stored data.

Step 505: Apply the erase pulse signal to the upper electrode of the storage unit so that the phase change material layer of the storage unit changes to the crystalline state, and apply the write pulse signal to the upper electrode of the storage unit so that the phase change material layer of the storage unit changes to an amorphous state, to store the to-be-stored data using the amorphous state.

In this embodiment, the crystalline state may be used to store the minimum data in the multi-bit data; correspondingly, the crystalline state may also be used to store maximum data in the multi-bit data, and corresponding method steps thereof are similar to those in the foregoing embodiment and are not described herein again.

Specifically, in this embodiment, the solution of the foregoing embodiment is specifically described using an example in which the minimum data in the multi-bit data is stored using the crystalline state, and beneficial effects thereof are similar to those in the foregoing embodiment and are not described herein again.

The write pulse signal including two same pulses in this embodiment is only a preferred solution in solutions of this embodiment, the present disclosure is not limited thereto, and the solution may also be implemented by a combination of more than two same pulses.

Figure 6:
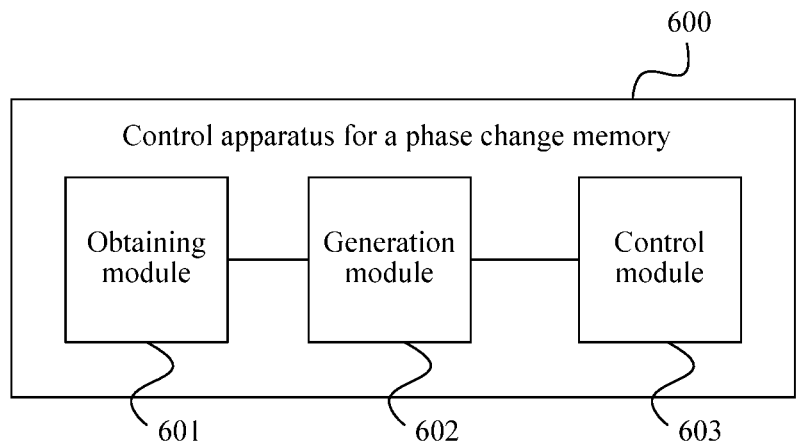
FIG. 6 is a schematic structural diagram of a control apparatus for a phase change memory according to Embodiment 5 of the present disclosure.

An embodiment further provides a control apparatus for a phase change memory. FIG. 6 is a schematic structural diagram of a control apparatus for a phase change memory according to Embodiment 5 of the present disclosure. As shown in FIG. 6, a control apparatus 600 for a phase change memory includes: an obtaining module 601, configured to obtain to-be-stored data, where the to-be-stored data is multi-bit data; a generation module 602, configured to generate an erase pulse signal and a write pulse signal according to the to-be-stored data, where the write pulse signal is a signal including at least two contiguous pulses, intervals between the at least two contiguous pulses are the same, and the intervals between the at least two contiguous pulses have a value determined according to the to-be-stored data; and a control module 603, configured to apply the erase pulse signal to a storage unit of the phase change memory so that the storage unit changes to a crystalline state, and apply the write pulse signal to the storage unit so that the storage unit changes to an amorphous state having a first resistance value, where a magnitude of the first resistance value and the intervals between the at least two contiguous pulses satisfy a particular function relationship, to represent the to-be-stored data using the amorphous state having the first resistance value of the storage unit.

Further, the control apparatus 600 for a phase change memory further includes: a determining module, configured to determine whether the to-be-stored data is maximum data or minimum data in the multi-bit data, where the generation module 602 is further configured to generate the erase pulse signal and the write pulse signal according to the to-be-stored data when the to-be-stored data is not the maximum data or the minimum data in the multi-bit data.

Preferably, the generation module 602 is further configured to generate the erase pulse signal according to the to-be-stored data when the to-be-stored data is the maximum data or the minimum data in the multi-bit data; and the control module 603 is further configured to apply the erase pulse signal to the storage unit so that the storage unit changes to the crystalline state, to represent the to-be-stored data using the crystalline state of the storage unit.

The solution of this embodiment provides a control apparatus for a phase change memory, which may implement the data storage method for a phase change memory in any one of the foregoing embodiments, and beneficial effects thereof are similar to those in the foregoing embodiments and are not described herein again.

Figure 7:
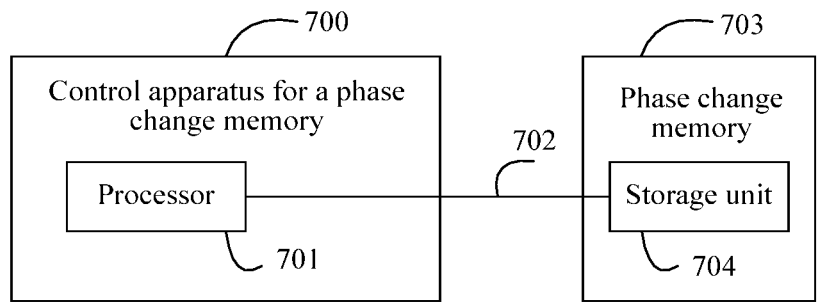
FIG. 7 is a schematic diagram of connection between a control apparatus for a phase change memory and a phase change memory according to Embodiment 6 of the present disclosure.

An embodiment further provides a control apparatus for a phase change memory. FIG. 7 is a schematic diagram of connection between a control apparatus for a phase change memory and a phase change memory according to Embodiment 6 of the present disclosure. As shown in FIG. 7, a control apparatus 700 for a phase change memory includes: a processor 701 and a control bus 702, where the processor 701 is connected to a storage unit 704 of a phase change memory 703 using the control bus 702.

The processor 701 is configured to execute the data storage method for a phase change memory in any one of the foregoing embodiments, and control, using the control bus 702, the storage unit 704 to perform data storage.

Preferably, the control apparatus 700 of the phase change memory further includes a memory, configured to store a program, and the processor 701 execute steps of the foregoing data storage method by invoking the program in the memory. The memory may include a high-speed random access memory (RAM) or may further include a non-volatile memory, for example, at least one magnetic disk memory.

The solution of this embodiment provides a control apparatus for a phase change memory, which may implement the data storage method for a phase change memory in any one of the foregoing embodiments, and beneficial effects thereof are similar to those in the foregoing embodiments and are not described herein again.

Figure 8:
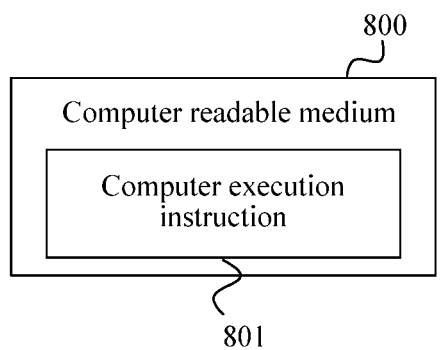
FIG. 8 is a schematic structural diagram of a computer readable medium according to Embodiment 7 of the present disclosure.

An embodiment of the present disclosure further provides a computer readable medium. FIG. 8 is a schematic structural diagram of a computer readable medium according to Embodiment 7 of the present disclosure. As shown in FIG. 8, a computer readable medium 800 includes a computer execution instruction 801. The computer execution instruction 801 can be invoked and executed by a processor of a computer. The computer execution instruction includes a computer instruction corresponding to any data storage method for a phase change memory described above.

The computer execution instruction included in the computer readable medium provided in the solution of this embodiment may include a computer instruction corresponding to the data storage method for a phase change memory in any one of the foregoing embodiments, to be invoked and executed by the processor of the computer, and beneficial effects thereof are similar to those in the foregoing embodiments and are not described herein again.

A person of ordinary skill in the art may understand that all or some of the steps of the method embodiments may be implemented by a program instructing relevant hardware. The program may be stored in a computer readable storage medium. When the program runs, the steps of the method embodiments are performed. The foregoing storage medium includes: any medium that can store program code, such as a ROM, a RAM, a magnetic disk, or an optical disc.

Finally, it should be noted that the foregoing embodiments are merely intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of the present disclosure.

What is claimed is:

1. A method, comprising:
obtaining a first to-be-stored data, wherein the first to-be-stored data is multi-bit data;
generating a first erase pulse signal and a first write signal according to the first to-be-stored data, wherein the first write signal is a signal comprising at least two sequential first pulses and at least one first interval, wherein each pulse of the at least two sequential first pulses is separated from an adjacent pulse of the at least two sequential first pulses by a first interval of the at least one first interval, wherein each first interval of the at least one first interval has a same duration, and wherein the duration of each first interval of the at least one first interval is determined according to the first to-be-stored data;

applying the first erase pulse signal to a storage unit of a phase change memory to enable the storage unit to change to a crystalline state; and applying the first write signal to the storage unit to enable the storage unit to change to a first amorphous state corresponding to a first resistance value, wherein the first amorphous state represents the first to-be-stored data, and wherein the first resistance value is higher than a resistance value of the storage unit in the crystalline state.

2. The method according to claim 1, wherein pulse widths of the at least two sequential first pulses in the first write signal are the same.

3. The method according to claim 2, wherein the pulse widths of the at least two sequential first pulses in the first write signal range from 30 ns to 50 ns.

4. The method according to claim 1, further comprising:
obtaining a second to-be-stored data which is different from the first to-be-stored data, wherein a quantity of bits in the second to-be-stored data equals a quantity of bits in the first to-be-stored data;

generating a second erase pulse signal and a second write signal according to the second to-be-stored data, wherein the second write signal is a signal comprising at least two sequential second pulses and at least one second interval, wherein each pulse of the at least two sequential second pulses is separated from an adjacent pulse of the at least two sequential second pulses by a second interval of the at least one second interval, wherein each second interval of the at least one second interval has a same duration, and wherein the duration of each second interval of the at least one second interval is determined according to the second to-be-stored data, and the duration of each first interval of the at least one first interval is different than the duration of each second interval of the at least one second interval;

applying the second erase pulse signal to the storage unit of the phase change memory to enable the storage unit to change to the crystalline state; and applying the second write signal to the storage unit to enable the storage unit to change to a second amorphous state corresponding to a second resistance value, wherein the second amorphous state represents the second to-be-stored data.

5. The method according to claim 1, further comprising:
obtaining a third to-be-stored data, wherein the third to-be-stored data equals a preset multi-bit data, and each bit in the third to-be-stored data is same;

generating a third erase pulse signal according to the third to-be-stored data; and applying the third erase pulse signal to the storage unit to enable the storage unit to change to a crystalline state, wherein the crystalline state of the storage unit represents the third to-be-stored data.

6. The method according to claim 1, wherein the duration of each first interval of the at least one first interval ranges from 10 ns to 50 ns.

7. The method according to claim 1, wherein the at least two sequential first pulses in the first write signal have a same amplitude.

8. The method according to claim 1, wherein the first write signal is a voltage signal comprising the at least two sequential first pulses, and amplitudes of the at least two sequential first pulses in the first write signal range from 1 V to 1.5 V.

9. A phase change memory, comprising:
a storage unit; and
a controller coupled to the storage unit, wherein the controller is configured to:
obtain a first to-be-stored data, wherein the first to-be-stored data is multi-bit data;
generate a first erase pulse signal and a first write signal according to the first to-be-stored data, wherein the first write signal is a signal comprising at least two sequential first pulses and at least one first interval, wherein each pulse of the at least two sequential first pulses is separated from an adjacent pulse of the at least two sequential first pulses by a first interval of the at least one first interval, wherein each first interval of the at least one first interval has a same duration, and wherein the duration of each first interval of the at least one first interval is determined according to the first to-be-stored data;
apply the first erase pulse signal to a storage unit of the phase change memory to enable the storage unit to change to a crystalline state; and
apply the first write signal to the storage unit to enable the storage unit to change to a first amorphous state corresponding to a first resistance value, wherein the first amorphous state represents the first to-be-stored data, and wherein the first resistance value is higher than a resistance value of the storage unit in the crystalline state.

10. The phase change memory according to claim 9, wherein pulse widths of the at least two sequential first pulses in the first write signal are the same.

11. The phase change memory according to claim 10, wherein the pulse widths of the at least two sequential first pulses in the first write signal range from 30 ns to 50 ns.

12. The phase change memory according to claim 9, wherein the controller is further configured to:
obtain a second to-be-stored data which is different from the first to-be-stored data, wherein a quantity of bits in the second to-be-stored data equals to a quantity of bits in the first to-be-stored data;
generate a second erase pulse signal and a second write signal according to the second to-be-stored data, wherein the second write signal is a signal comprising at least two sequential second pulses and at least one second interval, wherein each second pulse of the at least two sequential second pulses is separated from an adjacent pulse of the at least two sequential second pulses by a second interval of the at least one second interval, wherein each second interval of the at least one second interval has a same duration, and wherein the duration of each second interval of the at least one second interval is determined according to the second to-be-stored data, and the duration of each first interval of the at least one first interval is different than the duration of each second interval of the at least one second interval;
apply the second erase pulse signal to the storage unit of the phase change memory to enable the storage unit to change to the crystalline state; and
apply the second write signal to the storage unit to enable the storage unit to change to a second amorphous state corresponding to a second resistance value, wherein the second amorphous state represents the second to-be-stored data.

13. The phase change memory according to claim 9, wherein the controller is further configured to:
- obtain a third to-be-stored data, wherein the third to-be-stored data equals a preset multi-bit data, and each bit in the third to-be-stored data is same;
- generate a third erase pulse signal according to the third to-be-stored data; and
- apply the third erase pulse signal to the storage unit to enable the storage unit to change to a crystalline state, wherein the crystalline state of the storage unit represents the third to-be-stored data.

14. The phase change memory according to claim 9, wherein the duration of each first interval of the at least one first interval ranges from 10 ns to 50 ns.

15. The phase change memory according to claim 9, wherein the at least two sequential first pulses in the first write signal have a same amplitude.

16. The phase change memory according to claim 9, wherein the first write signal is a voltage signal comprising the at least two sequential first pulses, and amplitudes of the at least two sequential first pulses in the first write signal range from 1 V to 1.5 V.

\* \* \* \* \*